United States Patent
Shimosaka

(10) Patent No.: US 7,360,128 B2
(45) Date of Patent: Apr. 15, 2008

(54) METHOD OF TESTING MEMORY DEVICE

(75) Inventor: Tomokatsu Shimosaka, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 352 days.

(21) Appl. No.: 10/402,181

(22) Filed: Mar. 27, 2003

(65) Prior Publication Data
US 2003/0188236 A1 Oct. 2, 2003

(30) Foreign Application Priority Data
Mar. 28, 2002 (JP) ............... 2002-093211

(51) Int. Cl.
*G11C 29/00* (2006.01)
(52) U.S. Cl. ............ 714/718; 714/700; 365/201
(58) Field of Classification Search ............ 714/719, 714/700
See application file for complete search history.

(56) References Cited

U.S. PATENT DOCUMENTS

| | | | | |
|---|---|---|---|---|
| 3,979,734 A | * | 9/1976 | Pricer et al. ............... | 365/149 |
| 4,332,028 A | * | 5/1982 | Joccotton et al. .......... | 714/719 |
| 5,151,881 A | * | 9/1992 | Kajigaya et al. ............ | 365/233 |
| 5,276,648 A | * | 1/1994 | Yanagisawa et al. ....... | 365/201 |
| 5,625,597 A | * | 4/1997 | Hirose ........................ | 365/201 |
| 5,661,729 A | * | 8/1997 | Miyazaki et al. ........... | 714/719 |
| 5,831,918 A | * | 11/1998 | Merritt et al. .............. | 365/201 |
| 6,567,337 B1 | * | 5/2003 | Sprague et al. ............ | 365/233 |

FOREIGN PATENT DOCUMENTS

JP            59207095 A   *  11/1984

OTHER PUBLICATIONS

IBM Technical Disclosure Database, No. NN8006203. Memory Tester using Random Addresses and Random Data. vol. 23, issue 1, p. 203. Jun. 1980.*
Wikipedia Online Encyclopedia. Phase Locked Loop. http://en.wikipedia.org/wiki/Phase-locked_loop.*

* cited by examiner

*Primary Examiner*—Shelly Chase
*Assistant Examiner*—Steve Nguyen
(74) *Attorney, Agent, or Firm*—Katten Muchin Rosenman LLP

(57) ABSTRACT

A test method of a memory device equipped with an internal signal generating circuit which generates an internal signal with a fixed cycle asynchronous with a signal from the outside is disclosed in which when an entry information is input, an entry circuit generates an output upon discrimination that said memory device is satisfying conditions for performing test, and when an output of the entry circuit is generated and a memory arrangement of the memory device is in a write enable state, a gate circuit generates an output to activate a buffer circuit, by which the internal signal is written to the memory arrangement by being connected to a data write input of the memory arrangement via the buffer circuit, then reading the written data to the outside from the memory arrangement, and performing the measurement related to the internal signal by detecting data change points.

10 Claims, 18 Drawing Sheets

Tresult ; CYCLE DETERMINED BY THIS MEASUREMENT
Tb ; MINIMUM CYCLE
Ta ; MAXIMUM CYCLE

| ADDRESS | 0 | 1 | 2 | | N-1 | N | N+1 | N+2 | | M-1 | M | M+1 | M+2 |
|---|---|---|---|---|---|---|---|---|---|---|---|---|---|
| DATA | 0 | 0 | 0 | | 0 | 1 | 1 | 1 | | 0 | 1 | 1 | 1 |
| RESULT 1 | P | P | P | | P | F | F | F | | P | F | F | F |
| DATA | 0 | 0 | 0 | | 0 | 0 | 1 | 1 | | 0 | 0 | 1 | 1 |
| RESULT 2 | P | P | P | | P | P | F | F | | P | P | F | F |

DATA···DATA READ FROM MEMORY CELL

RESULT···DECISION RESULT AT TESTER

FIG. 13

| ADDRESS | 0 | 1 | 2 | | N-1 | N | N+1 | N+2 | | M-1 | M | M+1 | M+2 |
|---|---|---|---|---|---|---|---|---|---|---|---|---|---|
| DATA | 0 | 0 | 0 | | 0 | 1 | 1 | 1 | | 0 | 1 | 1 | 1 |
| RESULT 1 | P | P | P | | P | F | F | F | | P | F | F | F |
| DATA | 0 | 0 | 0 | | 0 | 0 | 1 | 1 | | 0 | 0 | 0 | 1 |
| RESULT 2 | P | P | P | | P | P | F | F | | P | P | P | F |

DATA···DATA READ FROM MEMORY CELL

RESULT···DECISION RESULT AT TESTER

FIG. 17

METHOD OF TESTING MEMORY DEVICE

BACKGROUND OF THE INVENTION

1. Field of the Invention

The present invention relates to a method of testing a memory device, and more particularly to a method of testing a memory device such as a semiconductor memory device equipped in its interior with a circuit which generates an internal signal having a fixed cycle asynchronous with a signal from the outside.

2. Description of the Prior Art

A device utilizing volatile memory cells of a dynamic random access memory (DRAM) process requires a refresh operation in order to prevent data destruction caused by a cell hold. Depending upon the product, however, there are some which automatically carry out the refresh control within the device without necessitating refresh control from the outside.

Such a memory device is normally equipped in its interior with a circuit which generates a signal (internal signal) having a fixed cycle, and the refresh operation of the memory cells is controlled based on the cycle of the internal signal.

The cycle of the internal signal of such a memory device is often used also as a critical signal which dominates various properties and circuit margins of the device. Under these circumstances, the waveform of the internal signal is normally taken out to the outside in the test mode or the like to be used for evaluation, analysis and the like.

Conventionally, the measurement of the cycle of the internal signal of a memory device has been carried out by outputting the signal to be measured from the internal circuit to an external measurement pin of the memory device by means of a test circuit part within the memory device, and connecting the pin to a waveform measurement instrument such as an oscilloscope.

In such a case, the test circuit part within the memory device is constituted by an entry circuit part and a switch (SW) circuit that are provided as an addition to the standard configuration of the memory device.

In FIG. 18 is shown an example of the configuration of a conventional memory device illustrated as a static random access memory (SRAM) in which the circuit portion for refresh is omitted for the sake of simplicity of the description.

As shown in FIG. 18, the conventional memory device generally comprises a word select address pin group 1, a digit select address pin group 2, an I/O pin group 3, a /CS pin 4, a /WE pin 5, an /OE pin 6, an entry pin 7, a measurement pin 8, an AND circuit 9, an AND circuit 10, an AND circuit 11, a row address buffer part 12, a row decoder part 13, a column address buffer part 14, a column decoder part 15, a memory cell array part 16, a data input (DIN) buffer 17, an input control part 18, a write amplifier circuit part 19, a sense amplifier circuit part 20, an output control part 21, an internal signal generation circuit part 22, an entry circuit part 23 and a switch (SW) circuit 24.

Of these components, the entry pin 7, the measurement pin 8, the internal signal generation circuit part 22, the entry circuit part 23 and the switch circuit 24 form a test circuit part 100.

The word select address pin group 1, the digit select address pin group 2, the I/O pin group 3, the /CS pin 4, the /WE pin 5 and the /OE pin 6 form an external input/output pins of the SRAM.

The word select address pin group 1 inputs row address data for word line selection consisting of a plurality of bits. The digit select address pin group 2 inputs column address data for digit line selection consisting of a plurality of bits. The I/O (data input/output) pin group 3 inputs write data to the memory cell array part 16, and outputs read data from the memory cell array part 16. The /CS (chip select) pin 4 inputs chip select signals for setting various parts of the memory device to operating conditions.

The /WE (write enable) pin 5 inputs a write enable signal for selecting the write operation and the read operation of data for the memory cell array part 16. The /OE (output enable) pin 6 inputs an output enable signal for outputting read data. The entry pin 7 inputs entry conditions for activating the test circuit. The measurement pin 8 outputs the internal waveform for the measurement.

The AND circuit 9 generates a high level output when both of the input to the /CS pin 4 and the input to the /WE pin 5 are at low level, and generates a low level output otherwise. The AND circuit 10 generates a high level output when the input to the /CS pin 4 is at low level and the input to the /WE pin 5 is at high level, and generates a low level output otherwise. The AND circuit 11 generates a high level output when the input to the /OE pin 6 is at low level and the output of the AND circuit 10 is at high level, and generates a low level output otherwise.

The row address buffer part 12 generates a buffered output of row address data from the word select address pin group 1. The row decoder part 13 selects a word line by decoding row address data consisting of a plurality of bits. The column address buffer part 14 generates a buffered output of column address data from the digit select address pin group 2. The column decoder part 15 selects a digit line by decoding column address data consisting of a plurality of bits.

The memory cell array part 16 is equipped with a plurality of memory cells arrayed in a matrix form corresponding to the word lines and the digit lines, and the memory cell at the intersection of the selected word line and the digit line is brought to write or read enable state.

The data input buffer 17 generates a buffered output of input data from the I/O pin group 3 when the output of the AND circuit 9 is at high level. The input control part 18 outputs input data from the data input buffer 17 when the output of the AND circuit 9 is at high level.

The write amplifier circuit part 19 amplifies the output from the input control circuit 18 and outputs the result to the selected digit line when the output of the AND circuit 9 is at high level. The sense amplifier circuit part 20 amplifies the input from the digit line and output the result when the output of the AND circuit 10 is at high level. The output control part 21 outputs the input from the sense amplifier circuit part 20 to the I/O pin group 3 when the output of the AND circuit 11 is at high level.

The internal signal generation circuit part 22 generates an internal signal of a fixed cycle asynchronous with a signal from the outside. Here, what is meant by signals from the outside are signals from the outside other than a power supply to the memory device, which include, for example, a signal input to the I/O pin group, the address pin group, /CS pin, /OE pin or entry pin, and the like.

The entry circuit part 23 determines whether an input information from the entry pin 7 satisfies entry conditions or not, and generates a high level output when it satisfies the conditions. The switch circuit 24 outputs an internal signal from the internal signal generation circuit part 22 to the measurement pin 8 when the output of the entry circuit part 23 is at high level.

Next, referring to FIG. 18 and FIG. 19, the configuration and the functions of the conventional memory device including the test circuit will be described.

In the following, in order to simplify the description, the circuit configuration and the circuit operation of the conventional memory device as an SRAM, omitting the circuit portion for refresh, will be described briefly.

Normally, the SRAM has, as external input/output pins, the address pin groups (the word select address pin group 1 and the digit select address pin group 2), the I/O pin group 3, the /CS pin 4, the /WE pin 5 and the /OE pin 6.

When the input to the /CS pin 4 is at high level, the SRAM is in unselected state, and write and read to and from the memory cell in the memory cell array part 16 will never take place whatever states the other pins are in.

On the contrary, when the input to the /CS pin 4 is at low level, the SRAM is in selected state, and when the input to the /WE pin 5 is at high level, the SRAM goes to the read state, and reads data from the memory cell corresponding to the address selected then by the address pin group. Besides, when the input to the /WE pin 5 is at low level, it goes to the write state, and writes data from the I/O pin group 3 to the memory cell corresponding to the address selected then by the address pin group.

Moreover, in the read state, the data read from the memory cell is output to the outside from the I/O pin group 3 only when the input to the /OE pin 6 is at low level, and the output from the I/O pin group 3 to the outside is in the high impedance state when the input to the /OE pin 6 is at high level.

In order to realize the operation as described in the above, the following circuit configuration is taken normally for the SRAM device.

First, the circuit blocks related to the address selection will be described. The address pin group is divided into a pin group (the word select address pin group 1) for selecting a word line, and another group (the digit select address group 2) for selecting a digit line. The word select address pin group 1 is connected to the row decoder part 13 via the row address buffer part 12, and the row decoder part 13 performs the selection of a word line within the memory cell array part 16. Moreover, the digit select address pin group 2 is connected to the column decoder part 15 via the column address buffer part 14, and the column decoder part 15 performs selection of a digit line within the memory cell array part 16.

Next, the circuit blocks related to the write operation will be described. The I/O pin group 3 is connected to the input of the data input buffer 17, the output of the data input buffer 17 is connected to the input of the input control part 18, and the output of the input control part 18 is connected to the input of the write amplifier circuit part 19.

Data input from the I/O pin group 3 is transmitted to the write amplifier circuit part 19 via the data input buffer 17 and the input control part 18, and the data amplified in the write amplifier circuit part 19 is output on the digit line selected in response to the column address. In this way, the data is written to the memory cell whose word line is selected, among memory cells connected to the selected digit line within the memory cell array part 16.

Next, the circuit blocks related to the read operation will be described. The output of the sense amplifier circuit part 20 is connected to the input of the output control part 21, and the output of the output control part 21 is connected to the I/O pin group 3. In this way, data in the memory cell on the selected word line within the memory cell array part 16 is output onto a digit line, and data on the selected digit line is transmitted to the sense amplifier circuit part 20, and the data amplified by the sense amplifier circuit part 20 is output to the outside from the I/O pin group 3 via the output control part 21.

In addition to the above, the AND circuit 9 and the AND circuit 10 are provided in order to discriminate between the write state and the read state. Signals from the /CS pin 4 and the /WE pin 5 are connected to the AND circuit 9 and the AND circuit 10, and the system is configured such that the output (a) of the AND circuit 9 is at high level in the write state, and the output (b) of the AND circuit 10 is at high level in the read state, while the outputs of the AND circuit 9 and the AND circuit 10 are at low level in the other states Moreover, the AND circuit 11 is provided in order to discriminate whether or not it is in the state (DOUT output state) for outputting the data read to the outside. The output (b) of the AND circuit 10 and the signal from the /OE pin 6 are connected respectively to the inputs of the AND circuit 11, and the system is configured such that the output of the AND circuit 11 is at high level only when it is in the DOUT state and it is at low level otherwise.

The output (a) of the AND circuit 9 is connected to the data input buffer 17, the input control part 18 and the write amplifier circuit part 19, and when the output (a) is at high level, namely, in the write operation state, the data input buffer 17, the input control part 18 and the write amplifier circuit part 19 are activated, and the selected digit line and the write amplifier circuit part 19 are brought into the connected state.

In the meantime, the output (C) of the AND circuit 11 is connected to the output control part 21, and the system is configured such that the output control part 21 is activated when the output (C) is at high level, namely, when it is in the DOUT state, but the output control part 21 is deactivated otherwise. In addition, the output (b) of the AND circuit 10 is connected to the sense amplifier circuit part 20, and during the read operation, the sense amplifier circuit part 20 is activated, so that the selected digit line and the sense amplifier circuit part 20 are brought into the connected state.

Moreover, the signal from the /CS pin 4 is connected to the row address buffer part 12 and the column address buffer part 14, and when the SRAM is in unselected state, the row address buffer part 12 and the column address buffer part 14 are deactivated, so that no selection of the word line and the digit line will take place.

The test circuit part 100 is provided with the entry pin 7 for inputting from the outside a designation (entry information) for activating the test circuit to the entry circuit part 23. The entry circuit part 23 is a circuit part for determining whether or not an input information from the entry pin 7 satisfies the conditions (entry conditions) for activating the test circuit, and the entry circuit part 23 outputs a high level signal only when the input to the entry pin 7 satisfies the entry conditions, and outputs a low level signal otherwise.

The circuits in the post-stage is configured by assuming that the test circuit goes to the activated state (entry state) when the output of the entry circuit part 23 is at high level, and the test circuit goes to the deactivated state (non-entry state) when it is at low level.

The output (d) of the entry circuit part 23 is connected to the switch circuit 24 to carry out the control of the output of the switch circuit 24. The input of the switch circuit 24 is connected to the internal signal generation circuit part 22, and the output of the switch circuit 24 is connected to the measurement pin 8 for measuring a signal to be measured from the outside.

When the output (d) of the entry circuit part 23 is at high level, namely, when the output is in the entry state, the switch circuit 24 outputs the signal to be measured, which is the output of the internal signal generation circuit part 22, to the measurement pin 8. On the other hand, when it is in the normally operating state, namely, when the output (d) of the entry circuit part 23 is at low level, the output of the switch circuit 24 goes to the high impedance state.

The output of the measurement pin 8 is connected to a waveform measurement device such as oscilloscope, and the measurement of the cycle of the signal to be measured is taken.

Conventionally, the cycle measurement of the signal to be measured, generated by the internal signal generation device, has been done by connecting a waveform measurement instrument such as oscilloscope to the measurement pin 8. Although, the measurement method by means of an oscilloscope or the like is effective for determination at the evaluation level in the trial manufacturing stage, it is not necessarily realistic and the feasibility is low to apply it to the test and sorting of the memory device in the mass production stage.

Moreover, the cycle of the internal signal is prone to dispersion due to manufacturing processes, and when the cycle deviates greatly from the design target of the device because of this, the memory device being a product in itself might be classified as a defective. For this reason, it becomes necessary to carry out the test according to a method which reproduces such a state, by anticipating nonconformity of the memory device when the cycle of the internal signal of the device deviates greatly from the design target, which leads to a problem that the test becomes unfavorably complicated.

Furthermore, there has been a problem in that it is difficult to take measurement of the internal signal that operates asynchronously with a signal from the outside by making use of the memory tester prepared expressly for the purpose of carrying out tests for the memory device.

FIG. 19 is a drawing for describing the measurement method of TAA (time from the generation of an address change to the output of the cell data) by the memory tester as an example of measurement of the change in the time of the output signal waveform.

In the function test which carries out the read and write test of the memory device, when the strobe setting time (decision time) is changed sequentially, with the time of occurrence of a change in the address in the read state as the start time (0s), the decision result of the memory tester is FAIL up to the timing when data from the cell has not yet been output, and it becomes PASS following the output of the data.

In this manner, it is possible to measure TAA by observing the time at which the decision result of the memory tester changes from FAIL to PASS.

However, signals that can be measured by the function test are signals that are output within a fixed time with the change in the signal (here, a change in the address) input to the memory device from the memory tester, and a signal asynchronous with a signal from the outside cannot be tested because it is impossible to set the time (0s) which serves as a reference for the measurement on the memory tester.

Moreover, to change the strobe time, it is necessary to change the pattern of address change to be input to the device from the memory tester, in order to set the measurement start time from that in the preceding measurement to that in the next measurement. Because of this, the measurement has to be done, after the change in the strobe time, according to an entirely different time base compared with that before the change, so that the measurement cannot be carried out in a simple manner.

As described in the above, for a memory device equipped with a circuit which generates an internal signal with a fixed cycle that is asynchronous with a signal from the outside, there has been a problem that it is difficult to carry out measurement on the cycle and the phase difference of the signal by means of the intrinsic functions and measurement method of the memory tester, by the use of the conventional memory tester.

BRIEF SUMMARY OF THE INVENTION

Summary of the Invention

The present invention provides a test method of a memory device equipped with an internal signal generating means which outputs an internal signal with a fixed cycle asynchronous with a signal from the outside, in which an entry circuit means generates an output when discriminating that the information satisfies conditions for the test to be carried out by the memory device, and when a memory means of the memory device is in a state enabled to write data, a gate means generates an output to activate a buffer means, by which the internal signal is written to the memory means by connecting the internal signal to a data write input of the memory means via the buffer means, and then the measurement relating to the internal signal is taken by reading the written data to the outside from the memory means and detecting data change points

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 13 is a drawing showing address and data at read of signals with different phases, in the memory device of the embodiment;

FIG. 17 is a drawing showing addresses and data at read of signals with different cycles in the memory device of the embodiment;

DETAILED DESCRIPTION OF THE INVENTION

Figure 1:
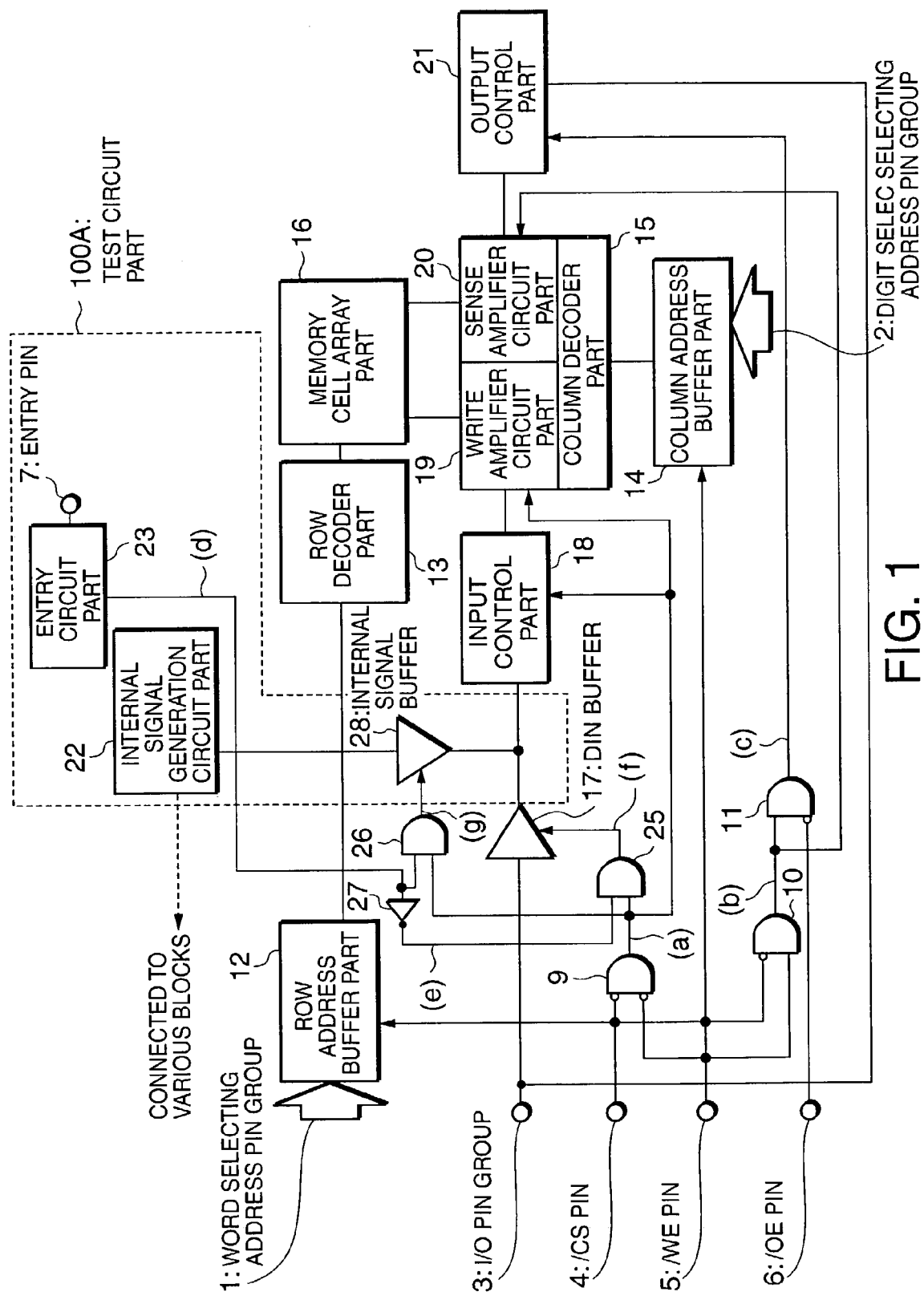
FIG. 1 is a block diagram showing the configuration of the memory device being a first embodiment of the present invention.

Referring to the drawings, the embodiments of the present invention will be described next.

Figure 2:
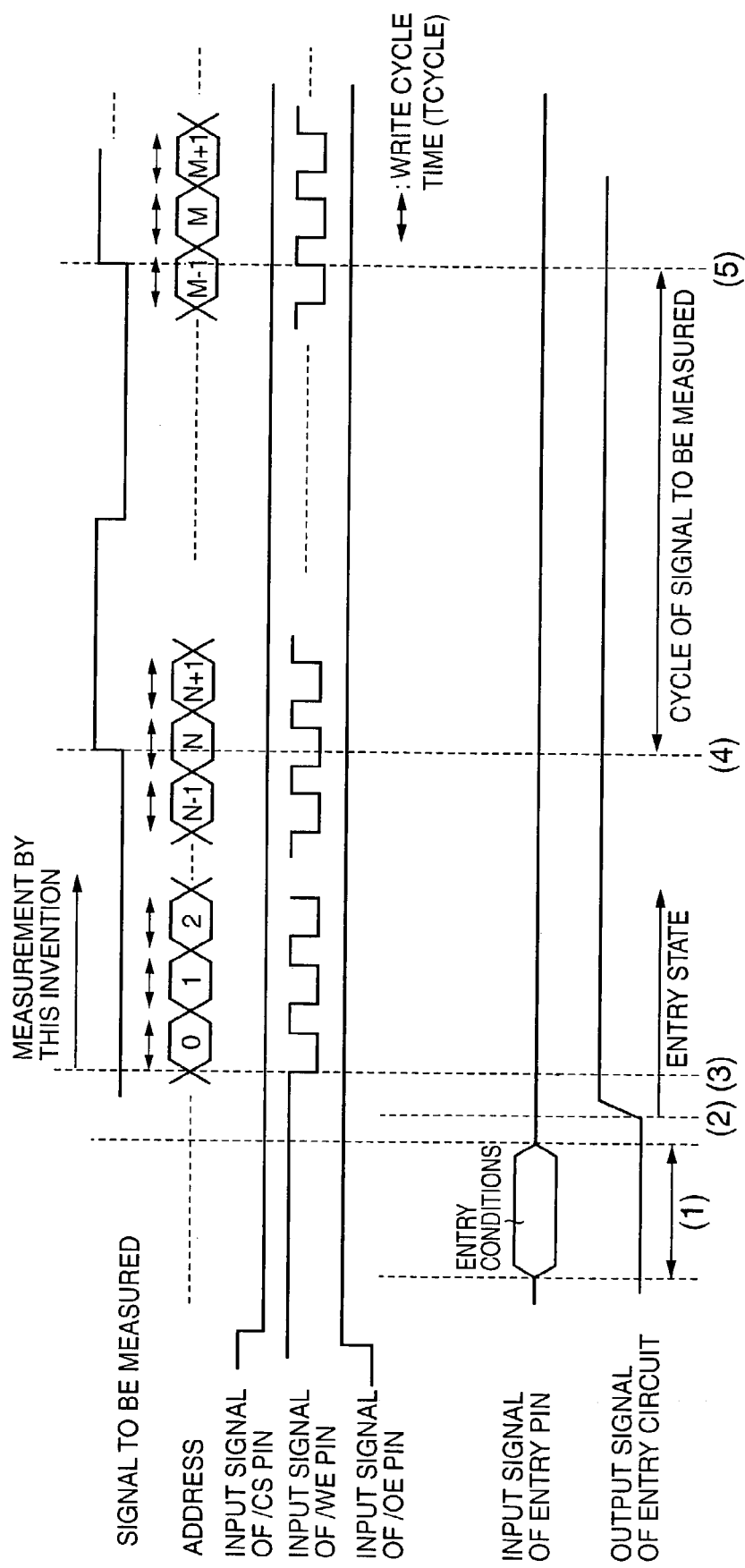
FIG. 2 is a drawing showing the timings of signals at write for various parts, in the memory device of the embodiment.
Figure 3:
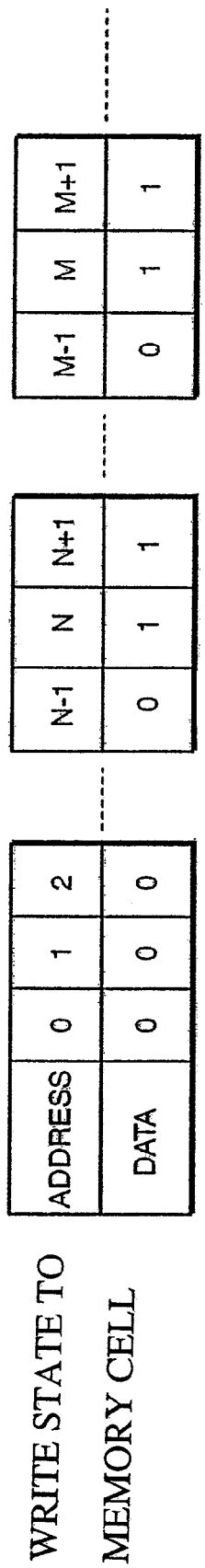
FIG. 3 is a drawing showing address and data at write, in the memory device of the embodiment.
Figure 4:
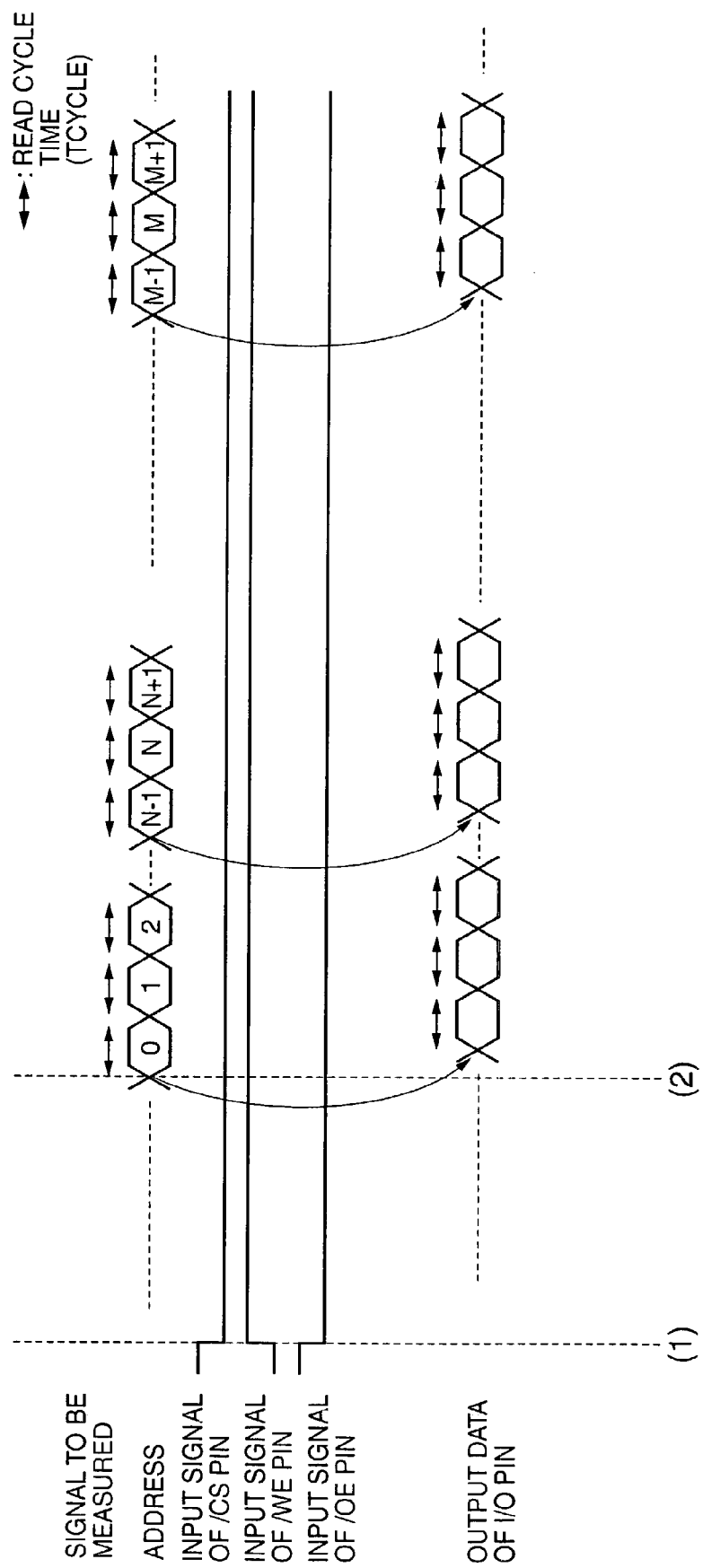
FIG. 4 is a drawing showing the timings of signals at read for various parts, in the memory device of the embodiment.
Figure 5:
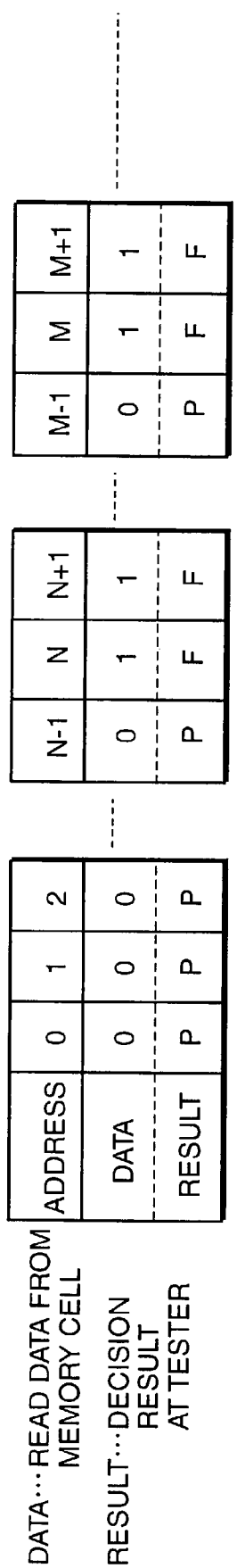
FIG. 5 is a drawing showing address and data at read, in the memory device of the embodiment.
Figure 6:
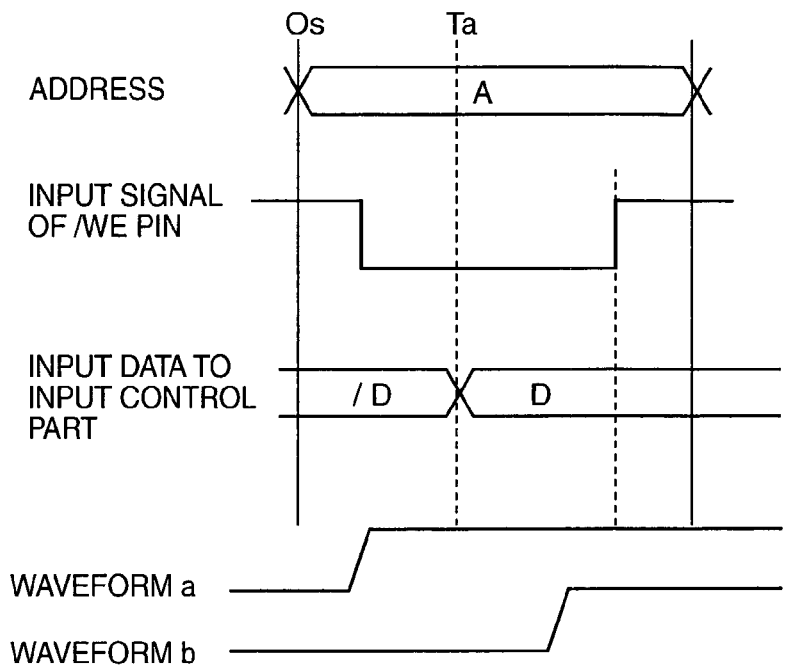
FIG. 6 is a drawing showing write conditions when data is changed, in the memory device of the embodiment.
Figure 7:
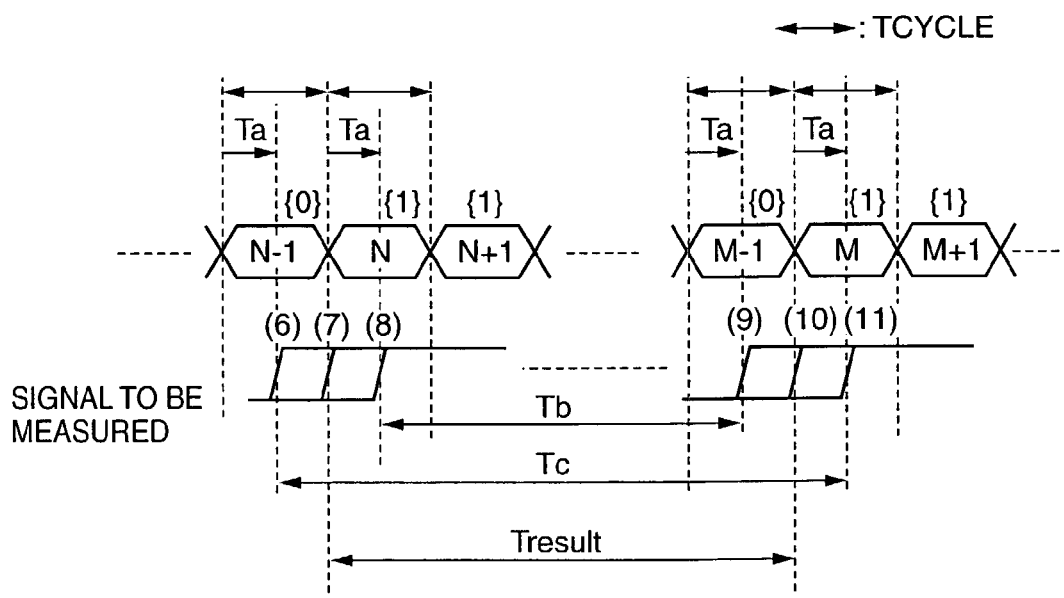
FIG. 7 is a drawing showing the measurement accuracy at measurement, in the memory device of the embodiment.
Figure 8:
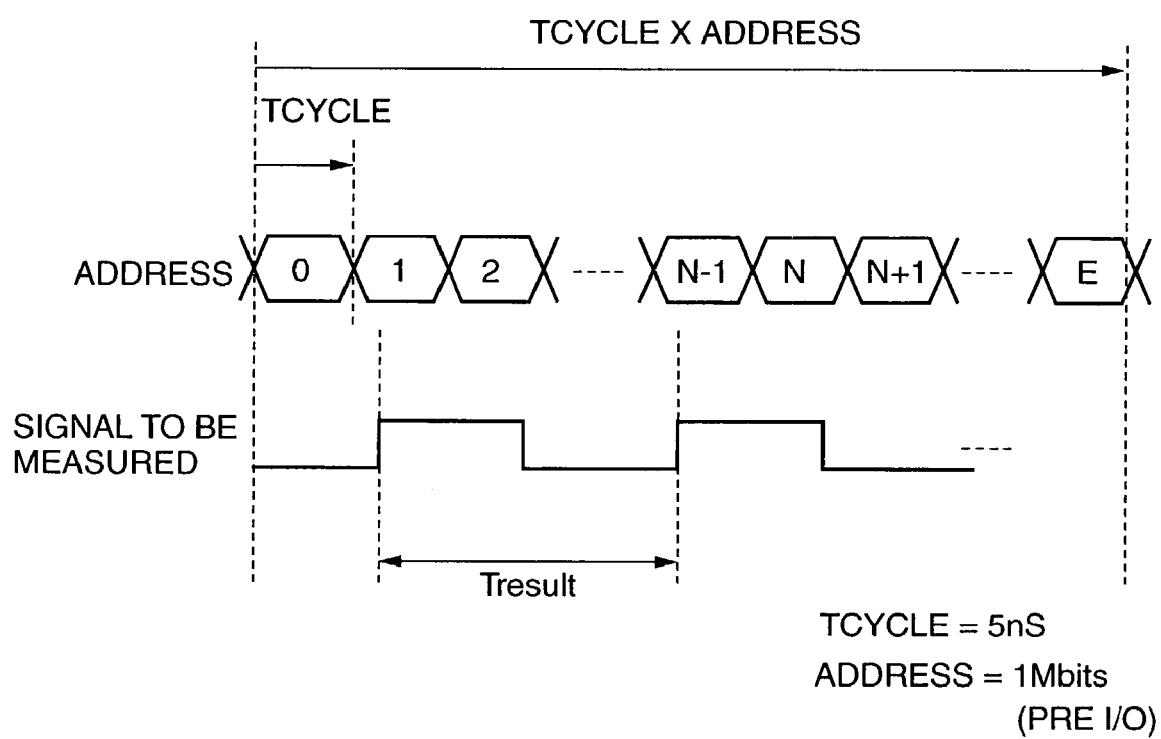
FIG. 8 is a drawing showing the measurement limits at measurement, in the memory device of the embodiment.

FIG. 1 is a block diagram showing the configuration of the memory device according to a first embodiment of the invention, FIG. 2 is a drawing showing the timings of signals for various parts at write, in the memory device of the embodiment, FIG. 3 is a drawing showing address and data at write, in the memory device of the embodiment, FIG. 4 is a drawing showing the timings of signals for various parts at read, in the memory device of the embodiment, FIG. 5 is a drawing showing address and data at read, in the memory device of the embodiment, FIG. 6 is a drawing showing write conditions when data is changed, in the memory device of the embodiment, FIG. 7 is a drawing showing measurement accuracy at cycle measurement, in the memory device of the embodiment, and FIG. 8 is a drawing showing measurement limits at cycle measurement, in the memory deice of the embodiment.

The memory device of this example comprises generally, as shown in FIG. 1, a word select address pin group 1, a digit select address pin group 2, an I/O pin group 3, a /CS pin 4, a /WE pin 5, an /OE pin 6, an entry pin 7, an AND circuit 9, an AND circuit 10, an AND circuit 11, a row address buffer part 12, a row decoder part 13, a column address buffer part 14, a column decoder part 15, a memory cell array part 16, a data input (DIN) part 17, an input control part 18, a write amplifier circuit part 19, a sense amplifier circuit part 20, an output control part 21, an internal signal generation circuit part 22, an entry circuit part 23, an AND circuit 25, an AND circuit 26, an inverter 27 and an internal signal buffer 28.

Figure 18:
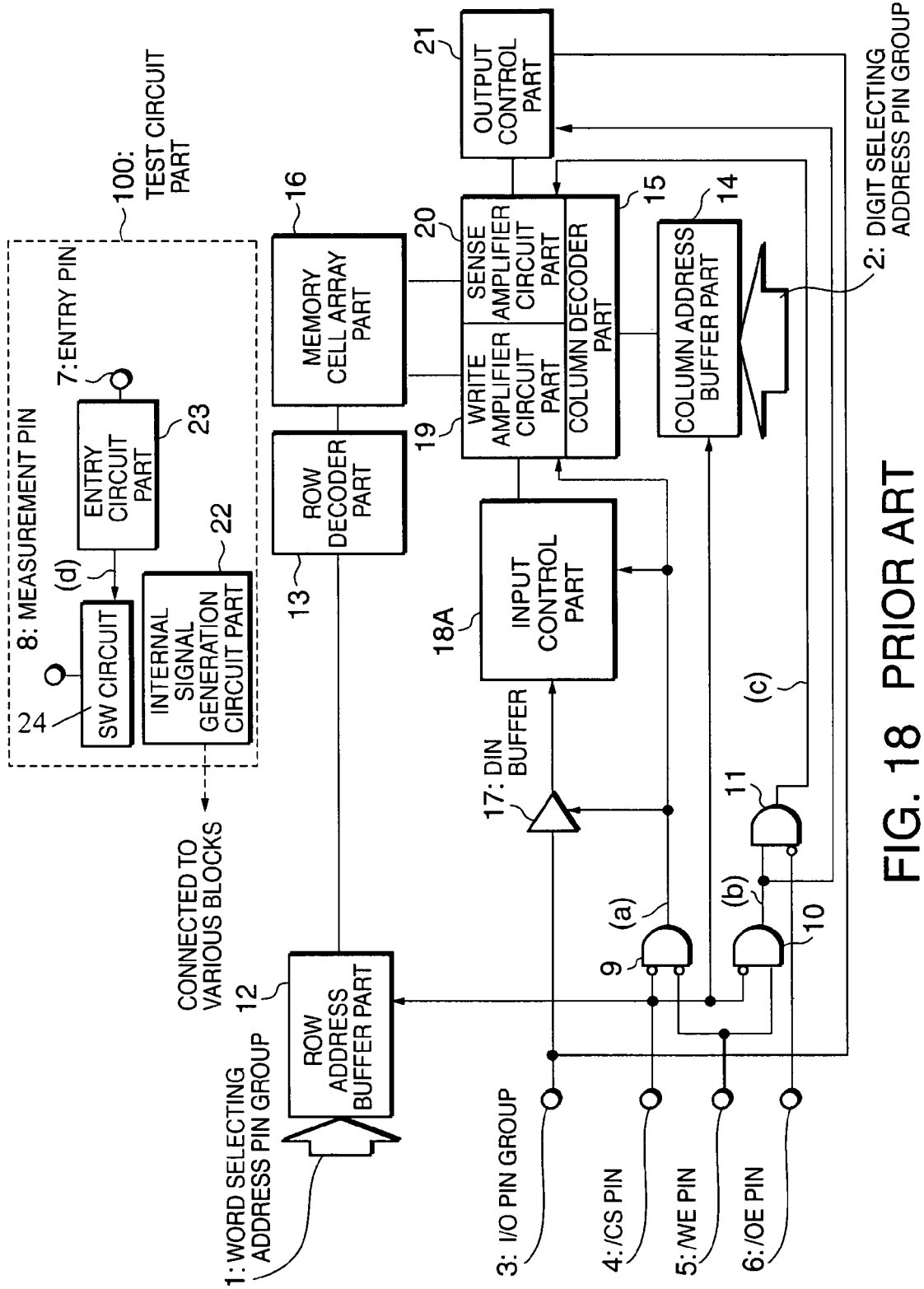
FIG. 18 is a drawing showing an example of configuration of a conventional memory device.
Figure 19:
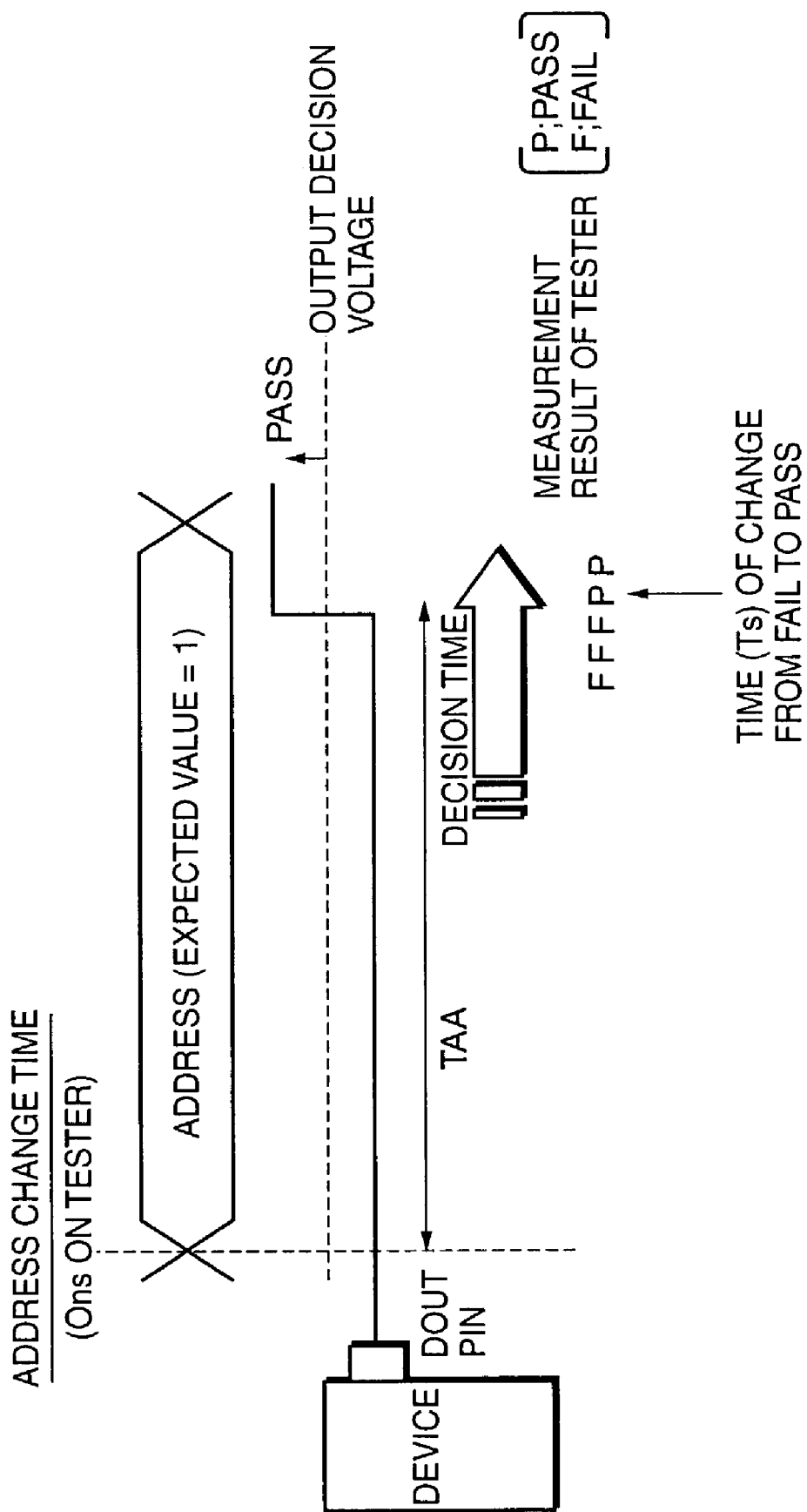
FIG. 19 is a drawing showing the configuration and functions of the conventional memory device -and the test circuit.

Of these components, the configuration and the functions of the word select address pin group 1, the digit select address pin group 2, the I/O pin group 3, the /CS pin 4, the /WE pin 5, the /OE pin 6, the entry pin 7, the AND circuit 9, the AND circuit 10, the AND circuit 11, the row address buffer part 12, the row decoder part 13, the column address buffer part 14, the column encoder part 15, the memory cell array part 16, the data input (DIN) buffer 17, the input control part 18, the write amplifier circuit part 19, the sense amplifier circuit part 20, the output control part 21, the internal signal generation circuit part 22 and the entry circuit part 23 are the same as those of the conventional example shown in FIG. 18, so that detailed description about these components will be omitted from the following.

The entry pin 7, the internal signal generation circuit part 22, the entry circuit part 23 and the internal signal buffer 28 constitute a test circuit part 100A in this example.

The AND circuit 25 generates a high level output when the output of the AND circuit 9 and the output of the inverter 27 are both at high level, and generates a low level output otherwise. The AND circuit 26 generates a high level output when the output of the AND circuit 9 and the output of the entry circuit part 23 are both at high level and generates a low level output otherwise. The inverter 27 generates an output in which the polarity of the output of the entry circuit part 23 is inverted. The internal signal buffer 28 generates a signal that buffers the output of the internal signal generation circuit part 22.

Next, referring to FIG. 1, the configuration and the functions of this example will be described.

First, in order to simplify the description about the memory device of this example, the circuit configuration and the circuit operation as an SRAM in which the circuit portion for refresh is omitted, will be described.

The memory device of this example differs from the conventional memory device shown in FIG. 18 in that it lacks the switch circuit 24 controlled by the output (d) of the entry circuit part 23 and the measurement pin 8 which outputs the internal signal from the internal signal generation circuit part 22 via the switch circuit 24, and has an internal signal buffer 28 for supplying the internal signal from the internal signal generation circuit part 22 to the input control part 18 in response to the output of the AND circuit 9, and that the operation of the data input buffer 17 is controlled in response to the output of the AND circuit 25.

Here, the AND circuit 26 generates a high level output when both of the output (d) of the entry circuit part 23 and the output (a) of the AND circuit 9 are at high level to activate the internal signal buffer 28, and the AND circuit 25 generates a high level output when both of the output (e) of the inverter 27 which inverts the output (d) of the entry circuit part 23 and the output (a) of the AND circuit 9 are at high level to activate the data input buffer 17.

In FIG. 1, the output (a) of the AND circuit 9 is connected to the input control part 18 and the write amplifier circuit part 19, and along with the output (e) obtained by inverting the output (d) of the AND circuit 9 via the inverter 27, it is connected to the inputs of the AND circuit 25.

Since the output (e) of the inverter 27 is fixed at high level in the normal using state (state in which the test circuit is deactivated) of the SRAM, the output (f) of the AND circuit 25 changes in the same phase as the output (a) of the AND circuit 9.

When the output (a) of the AND circuit 9 is at high level, namely, when the system is in the write operation, the input control part 18 is activated, and the selected digit line and the write amplifier circuit part 19 go to the connected state, and moreover, in the non-entry state where the output (d) of the entry circuit part 23 goes to low level, the data input buffer 17 is activated by the output (f) of the AND circuit 25.

In the meantime, the output (c) of the AND circuit 11 is connected to the output control part 21, and the system is configured such that when the output (c) is at high level, namely, when it is in the DOUT output state, the output control part 21 is activated, and the output control part 21 is deactivated otherwise.

Moreover, the output (b) of the AND circuit 10 is connected also to the sense amplifier circuit part 20, so that in the read state, the sense amplifier circuit part 20 is activated, and the selected digit line and the sense amplifier circuit part 20 are brought into the connected state.

Furthermore, the signal from the /CS pin 4 is connected to the row address buffer part 12 and the column address buffer part 14, and when the SRAM is in the unselected state, the row address buffer part 12 and the column address buffer part 14 are deactivated, so that selection of the word line and the digit line does not take place.

In the memory device in this example, the internal signal (signal to be measured), being the output of the internal signal generation circuit part 22 to be measured by the use of the test circuit, is connected to diversified circuit blocks of each memory device product, to be used as an input and for control of respective internal circuits, and in reality, the method of use of the output of the internal signal generation circuit part 22 is different for respective memory devices. Such internal signals include, for example, a signal for causing refresh of the memory cell, and various kinds of signal necessary for the internal control of the memory device. Since, however, the method of use of the output of the internal signal generation circuit part 22 has no special significance in the description of the present invention, the connection destination of the output and the method of use of the output of the internal signal generation circuit part 22 will not be touched upon here specifically.

Next, referring to FIG. 1, the circuit configuration of the test circuit in the memory device of this example will be described.

The signal to be measured from the internal signal generation circuit part 22 is connected to the input of the internal signal buffer 28, and the output of the internal signal buffer 28 is connected to the input of the input control part 18.

The test circuit part 100A is provided with the entry pin 7 for inputting conditions (entry conditions) for activating the test circuit, to the entry circuit part 23 from the outside.

The entry circuit part 23 is a circuit part for determining whether an input information from the entry pin 7 satisfies the entry conditions or not, and the entry circuit part 23 outputs a high level signal only when the input to the entry pin 7 satisfies the entry conditions, and outputs a low level signal otherwise. That the entry conditions are satisfied is determined, for example, by the fact that the input voltage of the entry pin exceeds a prescribed voltage within the device.

The circuit in the post-stage is configured assuming that the test circuit is in the activated state (entry state) when the output of the entry circuit part 23 is at high level, and the test circuit is in the deactivated state (non-entry state) when the output is at low level.

The output (d) of the entry circuit part 23 and the output (a) of the AND circuit 9 for determining the write state are connected to the input of the AND circuit 26. The output (g) of the AND circuit 26 is connected to the internal signal buffer 28, is at high level when it is in the write state as well as in the entry state, and activates the output of the internal signal buffer 28.

On the contrary, when it is in a state other than the above, the output (g) of the AND circuit 26 goes to low level, and sets the output of the internal signal buffer 28 to a high impedance state. The input control part 18 and the write amplifier circuit part 19 are in the activated state for all times when the output (a) of the AND circuit 9 is at high level.

Moreover, since the signal (e) obtained by converting the phase of the output (d) of the entry circuit part 23 into the opposite phase via the inverter 27 is connected to an input of the AND circuit 25 along with the output (a) of the AND circuit 9, input data from the I/O pin group 3 are transmitted to the input control part 18 through the data input buffer 17 when the system is in the non-entry state as well as in the write state.

On the contrary, in the entry state, since the output (e) of the inverter 27 goes to low level, the output (f) of the AND circuit 25 goes to low level for all times regardless of the level of the output (a) of the AND circuit 9, the output of the data input buffer 17 is deactivated in the entry state.

Since the output (d) of the entry circuit part 23 and the output (e) of the inverter 27 are in mutually opposite phase relation, the output of the internal signal buffer 28 and the output of the data input buffer 17 will never be activated simultaneously, the signal to be measured will be written to the memory cell when the system is in the write state as well as in the entry state, and the data from the I/O pin group 3 will be written to the memory cell when the system is in the write state and in the non-entry state.

Next, referring to FIG. 1 to FIG. 8, the measurement method of the internal signal in the memory device of this example will be described. The measurement of the internal signal in the memory device of this example is carried out by writing the internal signal to the memory cells and by reading the written data.

In FIG. 2, the changes in signals for various parts are shown when the test mode is used.

In the figure, a low level signal is input to the /CS pin 4 and a high level signal is input to the /OE pin 6. By inputting the entry conditions to the entry pin 7 for a period (1) in the figure, the output (d) of the entry circuit part 23 changes from low level to high level, and the entry state is held after the time (2) in the figure.

From a time (3) in the figure, address is incremented sequentially from address 0 to the final address with a certain fixed write cycle time (TCYCLE). Moreover, at the same time, by inputting a low level pulse to the input of the /WE pin 5 for each cycle, the level of the internal signal at that time is written to the memory cell during the period in which the input of the /WE pin 5 is at low level.

Within the period of TCYCLE, '0' is written to the memory cell when the internal signal is at low level, and '1' is written to the memory cell when the internal signal is at high level.

Here, the internal signal is a signal which is generated asynchronously with a signal from the outside, and the time at which it rises from low level to high level for the first time after entry is (4) in the figure, and the time of rise for the next time is (5) in the figure, so that the cycle of the signal to be measured is the time from (4) to (5).

FIG. 3 shows data in the memory cell at each address written according to the operation illustrated in FIG. 2.

Here, when data written to the preceding address (N−1) is '0', and the next written data is '1', the latter address is defined as address N, and thereafter, when data written to the preceding address (M−1) is '0', and the next written data is '1', the latter address is defined as address M.

FIG. 4 shows timings at read by the memory tester.

As shown in FIG. 4, by inputting a low level signal to the /CS pin 4 and a high level signal to the /WE pin 5, data read from the memory cells is started after time (1). Starting with the time (2), by giving address so as to increase sequentially from address 0 to the final address, data read is output from the I/O pin group 3 after a predetermined time for each address. Here, the time from address assignment to data output is determined for each product of the memory device.

In the read state, the memory tester is capable of determining, for data to be measured in the read cycle of a designated address, to assign '1' to a level on the higher side than an output decision level of the tester, and '0' to a level on the lower side. Moreover, since it has a function to change the decision time at that time, it is possible to set the decision time of such a read test at a time later than the time of output generation from the I/O pin group 3, and read the level by setting the expected value for deciding PASS to be fixed at '0' or '1', and the expected value for deciding FAIL to be fixed at '1' or '0', so that the sate of the output data for each address can be confirmed from the result of PASS or FAIL.

In FIG. 5 are shown address and data at read by the use of the memory tester.

The cycle of the signal to be measured can be determined by extracting an address N at which the data changes from '0' to '1', and an address M at which the data changes from '0' to '1' next from FIG. 5, and by multiplying the difference (M−N) by the cycle time (TCYCLE) for writing.

In FIG. 6 are shown write conditions when write data are changed.

When the time at which the write data to be input is switched from /D to D, during the change in the time, there exists a point at which the write data to the memory cell changes from /D to D. Here, the time of address change is called 0s, and the point in time at which the write data switches from /D to D is called Ta.

In this case, the waveform in which the signal changes from low level to high level at a timing earlier than Ta will be called a, and the waveform in which the signal changes from low level to high level at a timing later than Ta will be called b. Then, in the case of waveform a, since the change takes place at a timing earlier than Ta, '1', being the data of D, is written to an address A of interest, and in the case of waveform b, since the change takes place at a timing later than Ta, '0', being the data of /D, is written to the address A.

FIG. 7 describes the measurement accuracy at cycle measurement by taking as an example the relation between the addresses N and M at which the write data changed from '0' to '1', shown in FIG. 3, and the change points of the actual signal to be measured.

In FIG. 7, the time at which the signal to be measured rises is the period from (6) to (8), and the next time of rise is the period from (9) to (11).

Here, when the true value of the cycle of the signal to be measured is called Tresult, maximum cycle Tc in the present measurement is the period from (6) to (11) with the value Tresult+TCYCLE, and minimum cycle Tb is the period from (8) to (9) with the value Tresult−TCYCLE, therefore, the measurement accuracy is ±TCYCLE.

FIG. 8 describes the measurable limits according to the measurement method of this example.

As an example, the case will be described in which measurement is taken on the cycle of the signal to be measured for a memory device having an address of 1 Mbits per I/O, when the address is incremented from address 0 to the final address by assuming that the minimum write cycle time (TCYCLE) given by the memory tester is 5 ns.

Since the measurement of the cycle is performed by acquiring an address at which the signal to be measured changes from '0' to '1', and an address at which the signal changes from '0' to '1' next, the cycle Tresult obtainable by the measurement can be taken to less than ½ of the total addresses, namely, to less than 0.5 M×5 ns.

Moreover, the measurement accuracy at that time is 5 ns, being equal to the TCYCLE, but this value varies depending upon the cycle time given by the memory tester. When cycles longer than the above value are to be measured, cycles twice as large can be measured by taking TCYCLE to be 10 ns, and cycles of 10 times as large can be measured by taking TCYCLE to be 50 ns. Note, however, that since the measurement accuracy is deteriorated accordingly to 10 ns or 50 ns, it is necessary to use the tester within the guaranteed range of the measurement accuracy. To summarize:

$$\text{Cycle of the signal to be measured} = (M-N) \times (TCYCLE), \quad (1)$$

$$\text{Measurement accuracy} = \pm (TCYCLE). \quad (2)$$

In this manner, according to the memory device of this example, the evaluation and analysis of the cycle of the internal signal can be facilitated. Moreover, by preparing a circuit which makes the cycle of the internal signal adjustable by fuse cut, and by adjusting the cycle of the internal signal to a desired value by measuring the cycle in the wafer state, it becomes easy to trim the cycle of the internal signal for each device, and accordingly improve the yield of the memory device products and enhance the reliability of the products.

Next, as a second embodiment, a memory device which enables measurement of the phase difference between signals for a plurality of internal signals having different phases in the case of a multibit memory device, and a test method of the memory device will be described.

Figure 9:
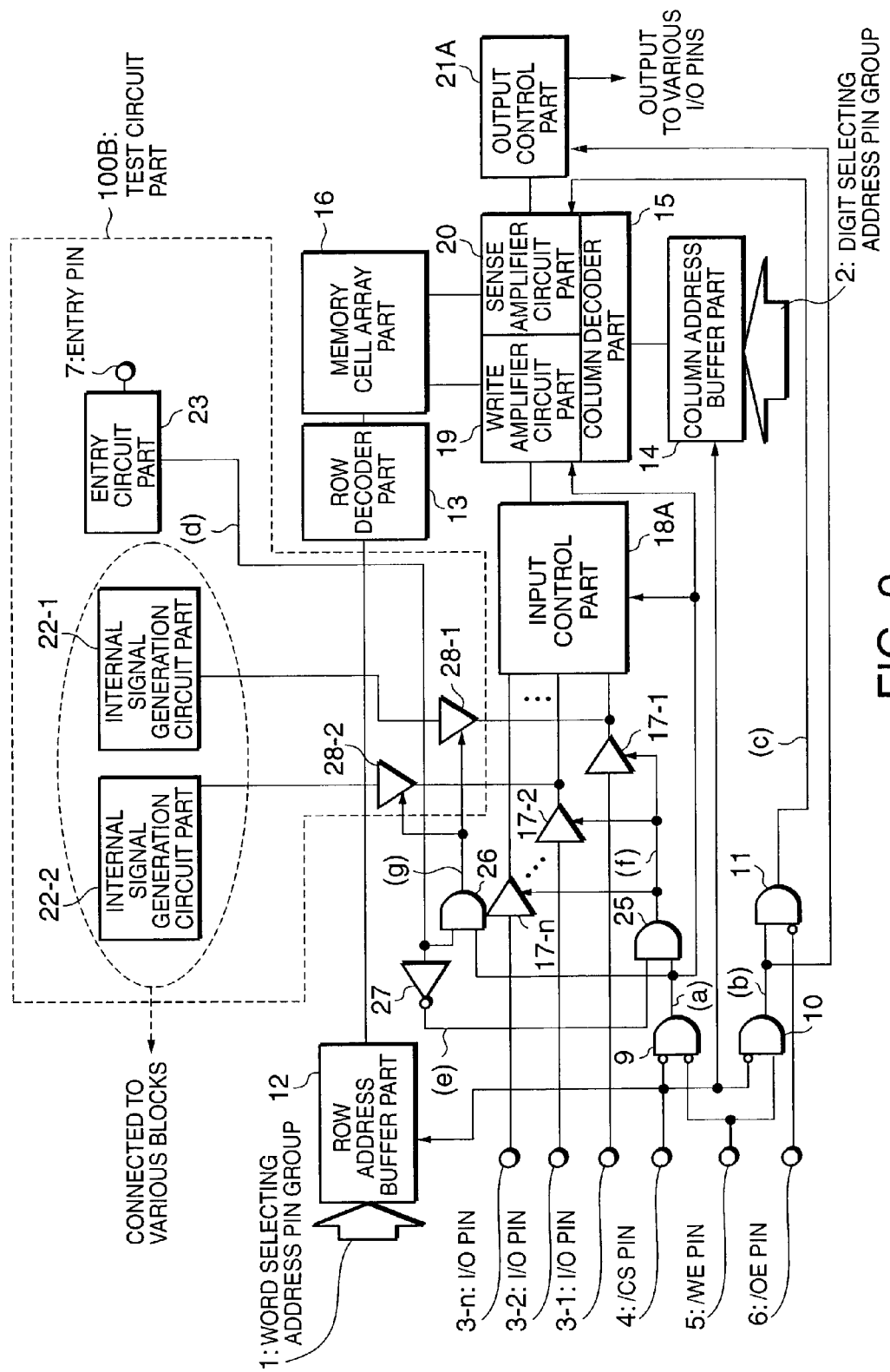
FIG. 9 is a block diagram showing the configuration of the memory device being a second embodiment of the invention.
Figure 10:
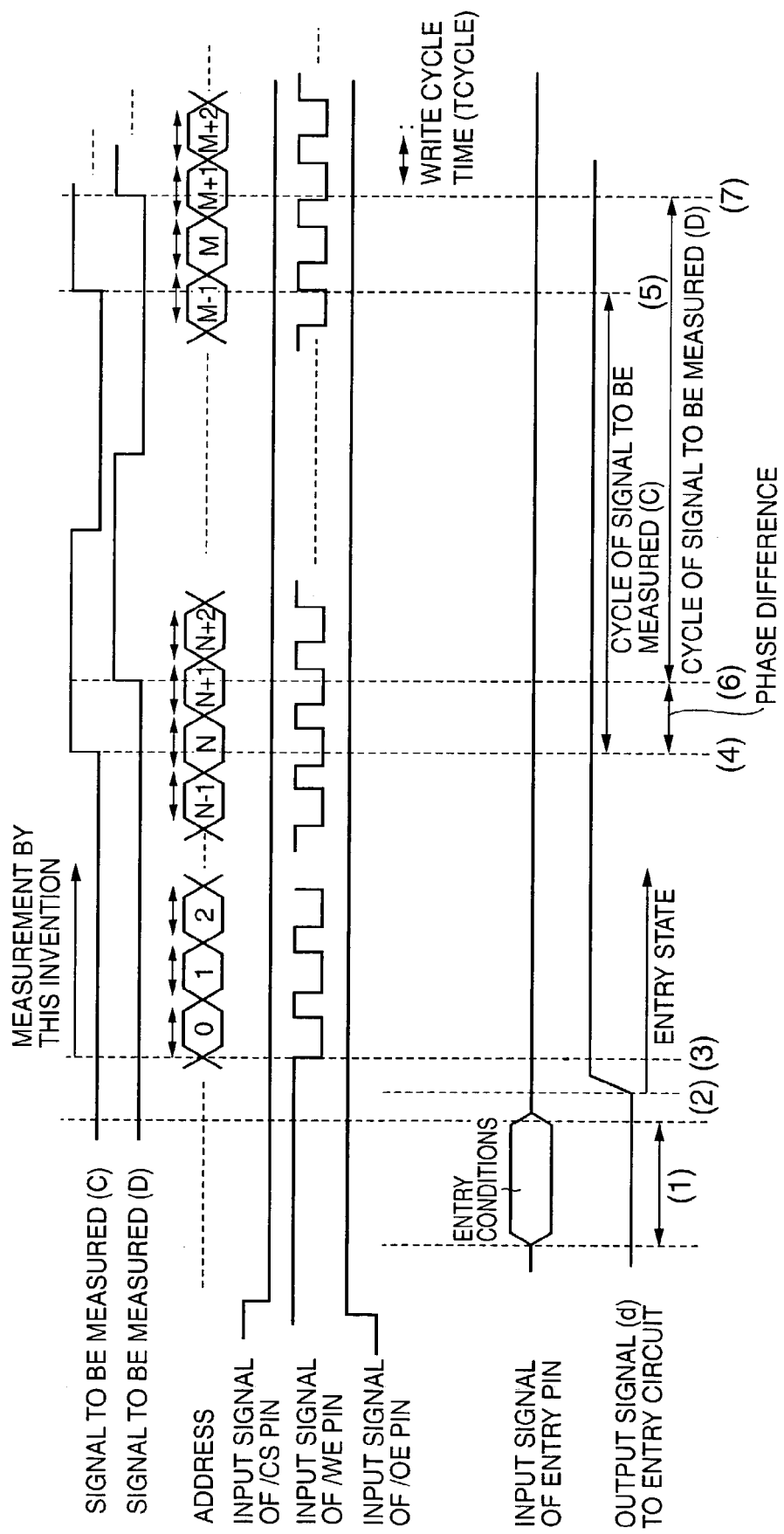
FIG. 10 is a drawing showing the timings at write of signals with different phases, in the memory device of the embodiment.
Figure 11:
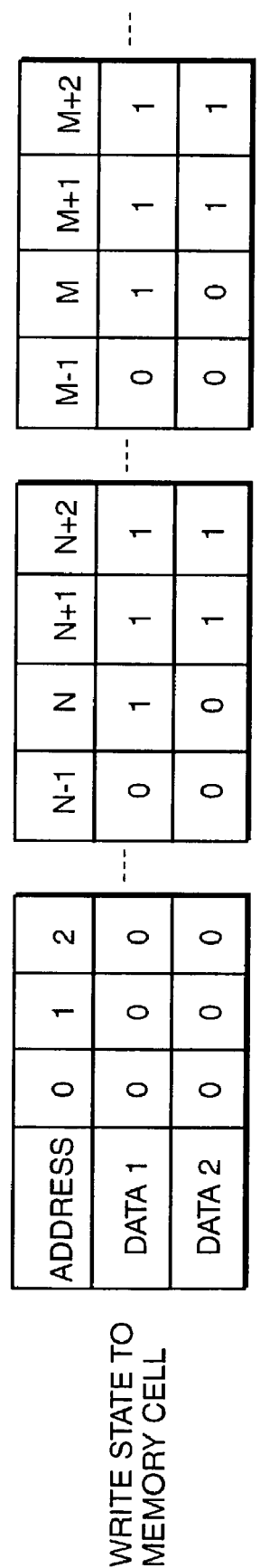
FIG. 11 is a drawing showing address and data at write of signals with different phases, in the memory device of the embodiment.
Figure 12:
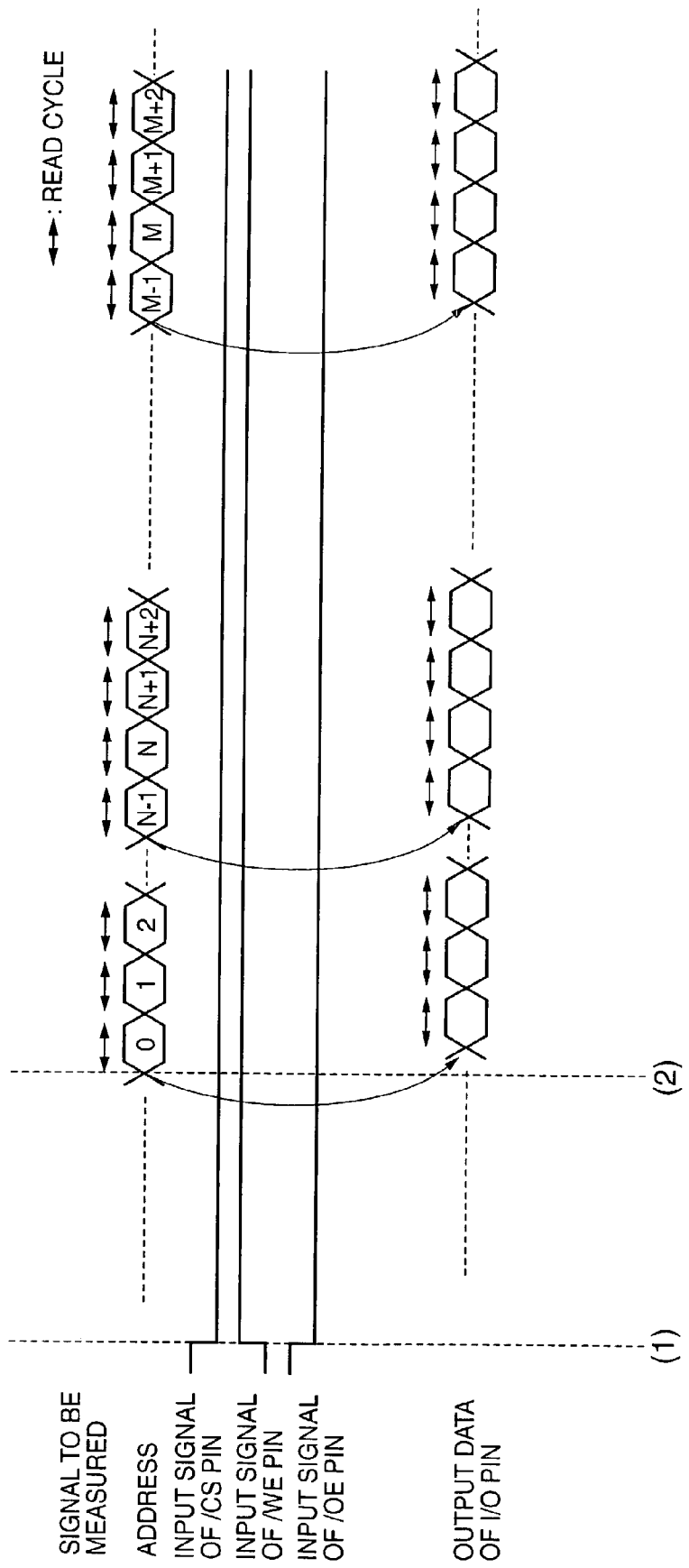
FIG. 12 is a drawing showing the timings at read of signals with different phases, in the memory device of the embodiment.

FIG. 9 is a block diagram showing the configuration of the memory device for a second embodiment of the invention, FIG. 10 is a drawing showing the timings at write of the waveforms of different signals, in the memory device of the embodiment, FIG. 11 is a drawing showing address and data at write of signals with different phases, in the memory device of the embodiment, FIG. 12 is a drawing showing the timings at read of signals with different phases, in the memory device of the embodiment, and FIG. 13 is a drawing showing address and data at read of signals with different phases, in the memory device of the embodiment.

The memory device of this example generally comprises, as shown in FIG. 9, a word select address pin group 1, a digit select address pin group 2, I/O pins 3-1 3-2, . . . , and 3-n, a /CS pin 4, a /We pin 5, an /OE pin 6, an entry pin 7, an AND circuit 9, an AND circuit 10, an AND circuit 11, a row address buffer part 12, a row address decoder part 13, a column address buffer part 14, a column decoder part 15, a memory cell array part 16, data input (DIN) buffers 17-1, 17-2, . . . , and 17-n, an input control part 18A, a write amplifier circuit part 19, a sense amplifier circuit part 20, an output control part 21A, internal signal generation circuit parts 22-1 and 22-2, an entry circuit part 23, an AND circuit 25, an AND circuit 26, an inverter 27 and internal signal suffers 28-1 and 28-2.

Of these components, since the configuration and the functions of the word select address pin group 1, the digit select address pin group 2, the /CS pin 4, the /WE pin 5, the /OE pin 6, the entrypin 7, the AND circuit 9, the AND circuit 10, the AND circuit 11, the row address buffer part 12, the row decoder part 13, the column address buffer part 14, the column decoder part 15, the memory cell array part 16, the write amplifier circuit part 19, the sense amplifier circuit part 20, the entry circuit part 23, the AND circuit 25, the AND circuit 26 and the inverter 27 are similar to those of the first embodiment shown in FIG. 1, a detailed description about these will be omitted in the following.

In this example, the system is configured so as to input the input data from the plurality of I/O pins 3-1 3-2, . . . , and 3-n to the input control part 18 via the corresponding plurality of data input buffers 17-1, 17-2, . . . , and 17-n, and to output the output data from the output control part 21A via the plurality of I/O pins 3-1, 3-2, . . . , and 3-n.

Moreover, there are provided two internal signal generation circuit parts 22-1 and 22-2 in order to generate internal signals, and corresponding to this, two internal signal buffers 28-1 and 28-2 are provided.

The entry pin 7, the internal signal generation circuit parts 22-1 and 22-2, the entry circuit part 23 and the internal signal buffers 28-1 and 28-2 constitute a test circuit part 100B in this example.

The data input buffers 17-1 17-2, . . . , and 17-n generate respectively buffered signals of the input data from the I/O pins 30-1 3-2, . . . , and 3-n when the output (f) of the AND circuit 25 is at high level. The input control part 18A outputs the input data from the data input buffers 17-1, 17-2, . . . , and 17-n when the output of the AND circuit 9 is at high level. The internal signal generation circuit parts 22-1 and 22-2 generate respectively internal signals of fixed cycles asynchronous with a signal from the outside. The internal signal buffers 28-1 and 28-2 generate respectively buffered signals of the signals from the internal signal generation circuit parts 22-1 and 22-2.

Next, referring to FIG. 9, the configuration and functions of the memory device of this example will be described. In the following description only the differences from the case of the first embodiment shown in FIG. 1 will be mentioned.

In a memory device having multibit, for example, n bits, input/output data, the phase measurement of a maximum of n internal signals is possible, but in this example, when the memory device has two internal signal generation circuit parts 22-1 and 22-2, the phase measurement between internal signals from the internal signal generation circuit parts 22-1 and 22-2 will be described.

First, circuit blocks related to write operation will be described. The I/O pin 3-1 is connected to the input of the data input buffer 17-1, the output of the data input buffer 17-1 is connected to an input of the input control part 18A, and the output of the input control part 18A is connected to the input of the write amplifier circuit part 19. Data input from the I/O pin 3-1 is transmitted to the write amplifier circuit part 19 via the data input buffer 17-1 and the input control part 18A, and the data amplified by the write amplifier circuit part 19 is output onto a selected digit line.

In this way, the data is written to the memory cell to which a word line is selected among memory cells connected to the selected digit line within the memory cell array part 16.

Analogously, the I/O pins 3-2, . . . , and 3-n are connected to the input of the data input buffers 17-2 , and 17-n, respectively, the outputs of the data input buffers 17-2, and 17-n are connected to the inputs of the input control part 18A, and the output of the input control part 18A is connected to the input of the write amplifier circuit part 19, 50 that data from I/O pins 3-2, . . . , and 3-n are connected to the input control part 18A via respectively separate data input buffers, and are written to separate memory cells through the write amplifier circuit part 19.

At this time, the output (f) of the AND circuit 25 is connected to the data input buffers 17-1, 17-2, . . . , and 17-n, and when the output (f) of the AND circuit part 25 is at high level, the outputs of the data input buffers 17-1, 17-2, . . . , and 17-n are activated simultaneously.

Next, the test circuit part 100B will be described. The output of the internal signal generation circuit part 22-1 is connected to the input of the internal signal buffer 28-1, and the output of the internal signal generation circuit part 22-1 is connected to the data line from the I/O pin 3-1 on the input side of the input control part 18A. Analogously, the output of the internal signal generation circuit part 22-2 is connected to the input of the internal signal buffer 28-2, and the output of the internal signal buffer 28-21 is connected to the data line from the I/O pin 3-2 on the input side of the input control part 18A.

The output (g) of the AND circuit 26 is connected to the internal signal buffers 28-1 and 28-2, respectively, outputs a high level signal when the system is in the write state as well as in the entry state, and activates the outputs of respective internal signal buffers 28-1 and 28-2. In a state other than the above, the output (g) of the AND circuit 26 goes to low level, and brings the outputs of respective internal signal buffers 28-1 and 28-2 to high impedance state.

The timings at write of internal signals with different phases in the memory device of this example will be described in FIG. 10, and the address and data at write of internal signals with different phases in the memory device of this example will be described in FIG. 11.

When signals to be measured are written to the memory cells while incrementing sequentially the address from address 0 to the final address with a fixed data write cycle time (TCYCLE) employing the same measurement method as in the first embodiment., the cycles of a signal to be measured (C) and a signal (D) to be measured are the period from time (4) to time (5) and from time (6) to time (7), respectively, and hence the phase difference between the two signals is the period from the time (4) to the time (6).

In FIG. 11, address N is defined, between the two signals to be measured, as the address at which the data of a preceding address is '0' and the following data is '1' for the first time, and address M is defined as the address at which a preceding data is '0' and the following data is '1' for a second time.

Moreover, what is meant by data 1 represents the written result of the signal to be measured (c), and data 2 represents the written result of the signal to be measured (D).

Next, as to the read method using the memory tester, the timings at read of signals with different phases will be describe in reference to FIG. 12, and the address and data at read of signals with different phases will be described in FIG. 13, respectively.

By employing the same measurement method as in the first embodiment, data for each address is output for each I/O pin, as shown in FIG. 12. In this case, the memory tester has the function of determining PASS or FAIL for each I/O pin, so that it is possible to extract the address at which change from PASS to FAIL takes place for each I/O pin.

The address which corresponds to such a change is, as shown in FIG. 13, the address N and the address M for the I/O pin 3-1, namely, for the waveform (c), and the address (N+1) and the address (M+1) for the I/O pin 3-2, namely , for the waveform (D).

Accordingly, in the example in FIG. 13, the phase difference between the two signals is equal to:

$$((N+1)-N) \times (\text{cycle time for write}) = \text{cycle time for write, (3) and the measurement error is equal to the cycle time for write.} \quad (3)$$

and the measurement error is equal to the cycle time for write.

As in the above, according to the memory device and the test method of the memory device of this example, the phase difference between two internal signals can be measured readily when the memory device has two internal signals Next, as a third embodiment, in the case of a multibit memory device, a memory device and a test method of the memory device which enables the measurement of respective cycles for a plurality of internal signals having different cycles, will be described.

Figure 14:
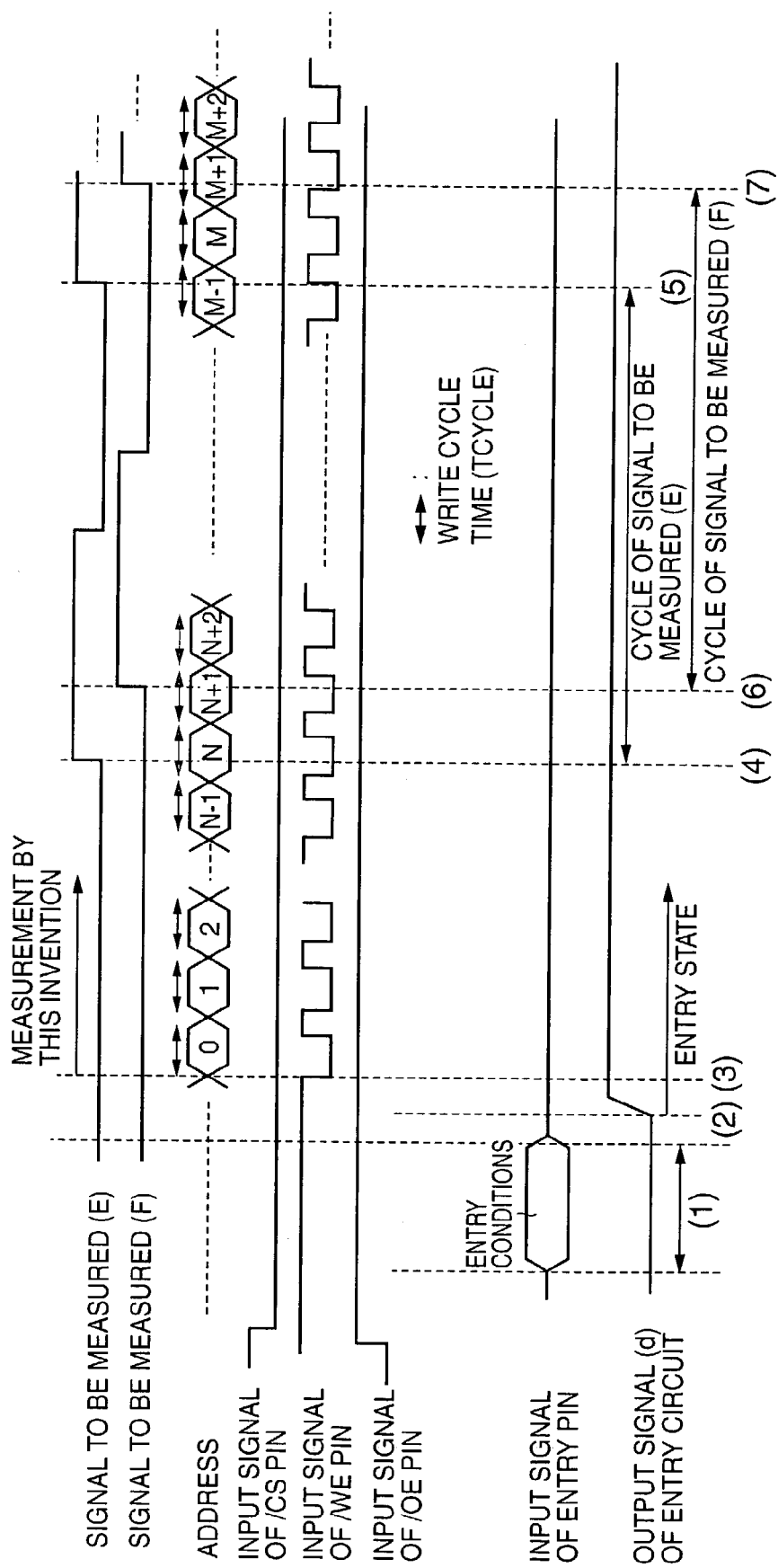
FIG. 14 is a drawing showing the timings at write of signals with different cycles, in the memory device of a third embodiment of the invention.
Figure 15:
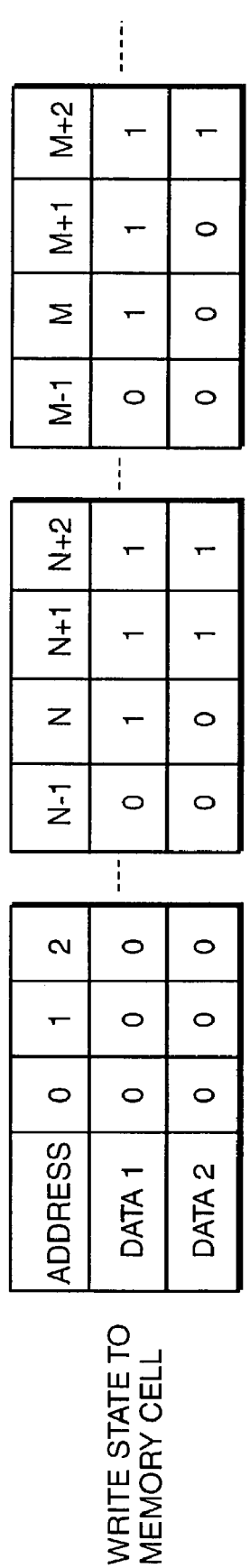
FIG. 15 is a drawing showing address and data at write of signals with different cycles, in the memory device of the embodiment.
Figure 16:
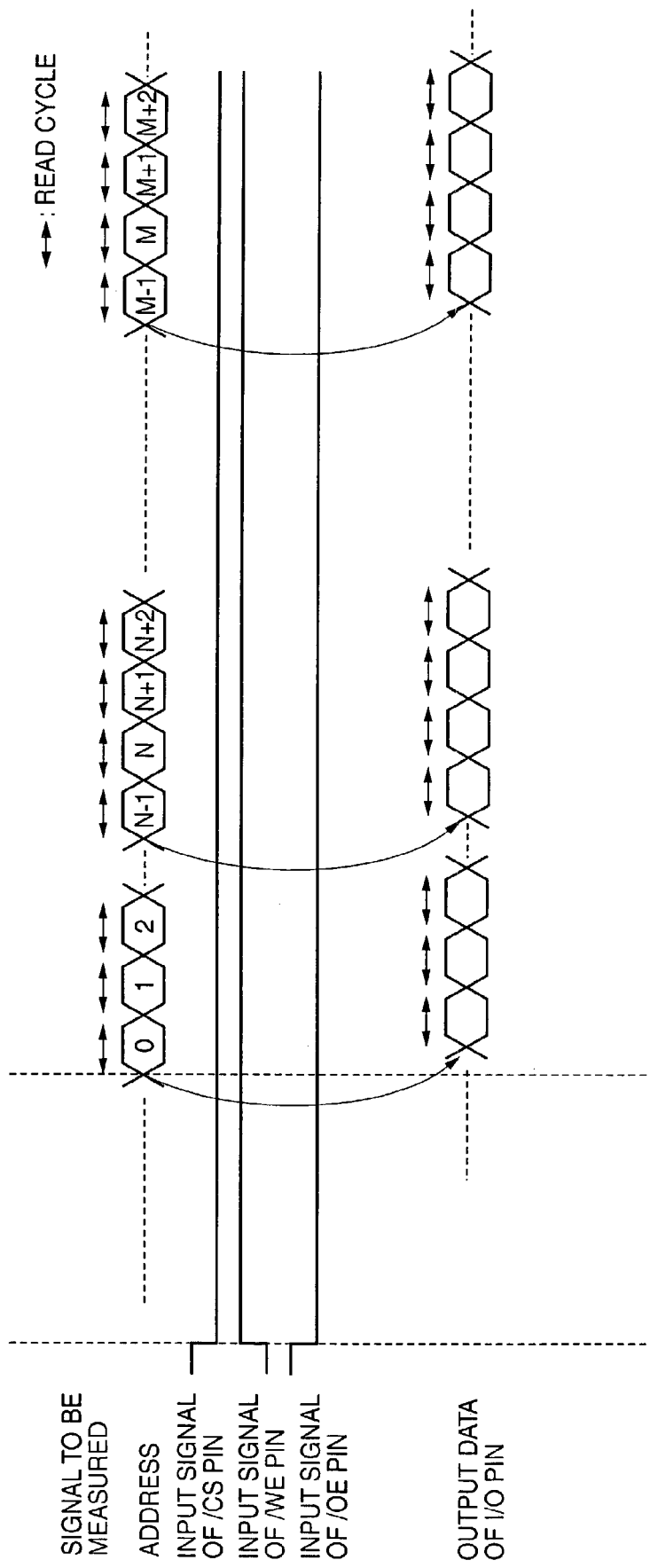
FIG. 16 is a drawing showing the timings at read of signals with different cycles in the memory device of the embodiment.

FIG. 14 is a drawing showing the timings at write of signals with different cycles, in the memory device of the third embodiment of the invention, FIG. 15 is a drawing showing address and data at write of signals with different cycles, in the memory device of this embodiment, FIG. 16 is a drawing showing the timings at read of signals with different cycles, in the memory device of this embodiment, and FIG. 17 is a drawing showing address and data at read of signals with different cycles, in the memory device of this embodiment.

The configuration of this example is the same as that of the second embodiment. For the case of writing similar to the case of the second embodiment, the timings at write of signals with different cycles will be described in FIG. 14, and address and data at write of signals with different cycles will be described in FIG. 15.

By employing the same measurement method as in the second embodiment, the cycles of a signal to be measured (E) and a signal to be measured (F) are the period from (4) to (5) and the period from (6) to (7), respectively.

In FIG. 15, of the two measured signals, for the measured signal (E) with advanced phase, the address at which the data of a preceding address is '0' and the following data is '1' for a first time is defined as address N, and the address at which a preceding address is '0' and the following address is '1' for a second time is defined as address M.

Moreover, data 1 represents the result of write of the measured signal (E), and data 2 represents the result of write of the measured signal (F).

Next, as to the read method using the memory tester, the timings at read of signals with different cycles will be described in FIG. 16, and address and data at read of signals with different cycles will be described in FIG. 17.

By employing the same measurement method as in the second embodiment, data for each address is output for each I/O pin, as shown in FIG. 16. In this case, since the memory tester has the function of performing determination between PASS and FAIL, it is possible to extract the address at which change from PASS to FAIL takes place for each I/O pin.

In the example in FIG. 17, the address at which PASS changes to FAIL is address N and address M for data of the I/O pin 3-1, namely, for the waveform (E), and address (N+1) and address (M+2) for data of the I/O pin 3-2, namely, for the waveform (F).

Accordingly, the cycle of the signal to be measured (E) is equal to (M N)×(cycle time at write), and the cycle of the signal to be measured (F) is equal to (M N+1)×(cycle time at write).

In this case, the cycle measurement error of respective signals is the cycle time at write.

As in the above, according to the memory device and the test method of the memory device of this example, it is possible to measure readily the cycles of two internal signals in the case of a memory device having two internal signals.

In the above, the embodiments of this invention have been described in detail by referring to the drawings. However, the specific configurations are not limited to these embodiments, and they are included in the invention even if there are introduced modifications of design or the like within the range which do not deviate from the scope of the invention. For example, the measurement of the phase difference between internal signals is not limited to the phase difference between specific two internal signals, and can be applied similarly to the phase difference between arbitrary two internal signals out of arbitrarily many internal signals. Moreover, the measurement of the cycles of two internal signals can be applied to arbitrary two internal signals out of arbitrarily many internal signals. The measurement of the phase difference or the cycle of two internal signals is not limited to the case of measurement which utilizes the input paths from the I/O pins 3-1 and 3-2, and can be performed by utilizing arbitrary two input paths out of input paths of n I/O pins, connecting them to internal signal buffers, by extracting address corresponding to each of these I/O pins. Moreover, the phase of one or a plurality of internal signals can be measured using the address as a reference.

The memory device of this invention is not limited to the semiconductor memory device, and is applicable also to any kind of memory device that generates internal signals with fixed cycles asynchronous with an external signal. Moreover, the invention is applicable also to the case in which the internal signal has not necessarily a constant cycle. Moreover, it is obvious that the test method of the memory device of this invention is not limited to the case of a memory device, and is also applicable to other devices containing a memory circuit, such as a large scale integrate circuit (LSI) of a microcomputer.

As described in the above, according to the test method of the memory device of this invention, in a memory device equipped with a means for generating one or a plurality of internal signals with fixed cycle asynchronous with an external signal, the internal signal is written to the memory by using address which changes at a constant cycle time and is then read, and the cycle and the phase difference or the like are measured, by converting the change point in the read data by means of the address value and the cycle time. As a result, the cycle, the phase difference, or the like of the internal signal can be measured without using a waveform measuring device such as oscilloscope, and accordingly, by applying this invention to mass production of the memory device or the like, it is possible to improve the productivity, and contribute to the improvement in the yield and the enhancement of the products because of the ease in the adjustment of the cycle of the internal signal in the internal signal generation circuit.

Although the invention has been described with reference to specific embodiments, this description is not meant to be construed in a limiting sense. Various modifications of the disclosed embodiments will become apparent to persons skilled In the art upon reference to the description of the invention. It is therefore contemplated that the appended claims will cover any modifications or embodiments as fall within the true scope of the invention.

What is claimed is:

1. A test method of a memory device equipped with an internal signal generating circuit adapted to output an internal signal of a fixed cycle asynchronous with a signal from the outside, the test method comprising:

generating by an entry circuit an output upon discrimination that said memory device is satisfying conditions for performing a test, when an entry information is input;

generating by a gate circuit an output to activate a buffer circuit when there is generated an output of said entry circuit and a memory arrangement of said memory device is in a write enable state induced by a write enable signal, by which said internal signal is written to said memory arrangement via said buffer circuit, said write enable signal being cycled at a rate higher than the cycle of said internal signal; and then performing a measurement related to said internal signal by reading written data to the outside from said memory arrangement and detecting change points in said written data;

wherein the measurement related to said internal signal is the measurement of the cycle of said internal signal.

2. A test method of a multibit memory device equipped with a plurality of internal signal generating circuits which output internal signals of respectively fixed cycles asynchronous with a signal from the outside, the test method comprising:

generating by an entry circuit an output upon discrimination that said memory device is satisfying conditions for performing a test, when an entry information is input;

generating by a gate circuit, when there is generated an output of said entry circuit and a memory arrangement of said memory device is in a write enable state induced by a write enable signal, an output to activate a plurality of buffer circuits, each of said buffer circuits corresponding to one of said plurality of internal signal generating circuits, by which said plurality of internal signals are written to said memory arrangement via the respective buffer circuit, said write enable signal being cycled at a rate higher than the cycle of said internal signal; and then performing measurements related to said plurality of internal signals by reading a plurality of written data to the outside from said memory arrangement and detecting change points of respective data;

wherein the measurements relating to said internal signals are the measurements of the cycles of respective internal signals from the plurality of internal signal generating circuits possessed by said memory device.

3. The test method as claimed in claim 2, wherein the cycle of said internal signal is measured by reading the written data from said memory arrangement, detecting two change points in said data, and determining the time between the two change points by calculating the product of a write cycle time and the difference between addresses corresponding to said two change points.

4. The test method of a memory device as claimed in claim 2, wherein the measurement related to said internal signal is the measurement of the phase difference between respective internal signals from two of the plurality of internal signal generating circuits possessed by said memory device.

5. The test method of a memory device as claimed in claim 4, wherein the phase difference between said two internal signals is measured by reading two written data from said memory arrangement, detecting change points in both data, and by determining the time between both change points by calculating the product of the write cycle time and the difference between addresses corresponding to both change points.

6. A semiconductor memory device comprising:
a memory cell array,
a set of data input or output pins,
an entry circuit generating an output upon discrimination that said memory device is satisfying conditions for performing a test, when an entry information is input;
a data read or write circuit performing a data read or write operation between said memory cell array and said data input or output pins,
a signal generation circuit generating an internal signal that takes a high level and a low level cyclically,
a test circuit that generates by a gate circuit an output to activate a buffer circuit for controlling in a test mode said data read or write circuit to write a level of said internal signal into said memory cell array in response to an output of said entry circuit and a write enable signal, said write enable signal being cycled at a rate higher than the cycle of said internal signal; and
a memory tester that measures the cycle of said internal signal by reading written data to the outside and detecting change points in said written data.

7. The semiconductor memory device as claimed in claim 6, wherein the data read or write circuit comprises:
an input control part transferring in the data read or write operation a write data to the memory cell array from the input or output pins and an internal signal buffer transferring in the test mode the internal signal to the memory cell array through input control part.

8. The semiconductor memory device as claimed in claim 7, wherein the data read or write circuit further comprises a data input buffer coupled between the data input or output pins and the input control part to supply the write data to the input control part, the data input buffer being deactivated in the test mode to allow the input control part to receive the internal signal.

9. The semiconductor memory device as claimed in claim 6, wherein the internal signal is generated by the signal generation circuit to refresh memory cells of the memory cell array.

10. A semiconductor memory device comprising:
a memory cell array,
a set of data input or output pins,
an entry circuit generating an output upon discrimination that said memory device is satisfying conditions for performing a test, when an entry information is input;
a data read or write circuit performing a data read or write operation between said memory cell array and said data input or output pins,
a signal generation circuit generating an internal signal that takes a high level and a low level cyclically,
a test circuit controlling in a test mode said data read or write circuit to write said levels of said internal signal into said memory cell array in response to an output of said entry circuit and a write enable signal, said write enable signal being cycled at a rate higher than the cycle of said internal signal;
an output control circuit coupled to said data read or write circuit to read said data in said memory cell array and to supply said data to said data input or output pins, said data being indicative of a pair of change points, each of said change points being responsive to a change of said internal signal between said high and low levels thereof; and
a memory tester that measures the cycle of said data.

* * * * *